United States Patent [19]
Sacks et al.

[11] Patent Number: 4,884,001
[45] Date of Patent: Nov. 28, 1989

[54] MONOLITHIC ELECTRO-ACOUSTIC DEVICE HAVING AN ACOUSTIC CHARGE TRANSPORT DEVICE INTEGRATED WITH A TRANSISTOR

[75] Inventors: Robert N. Sacks; William J. Tanski, both of Glastonbury, Conn.

[73] Assignee: United Technologies Corporation, Hartford, Conn.

[21] Appl. No.: 283,625

[22] Filed: Dec. 13, 1988

[51] Int. Cl.$^4$ ............................................. H01L 41/08
[52] U.S. Cl. ........................ 310/313 A; 310/313 R; 333/195; 357/26; 29/25.35
[58] Field of Search .......... 310/313 R, 313 A, 313 B, 310/313 D; 333/195, 154; 357/26; 346/1, 158, 162; 367/7; 358/201, 213, 296; 265/103, 114, 118; 330/4.6, 5.5; 324/111, 113, 109, 102, 78 E, 77 R, 77 A; 235/181; 343/17.1, 100 C; 250/370, 395, 301; 156/643, 646, 656, 659.1

[56] References Cited
U.S. PATENT DOCUMENTS 3,294,988 12/1966 Packard ........................ 310/338 X
3,351,786 11/1967 Muller et al. ................ 310/338 X
3,426,424 2/1969 Touchy ......................... 310/338 X
3,585,415 6/1971 Muller et al. ................ 310/358 X
4,600,853 7/1986 Whitlock et al. ............... 310/313 B
4,611,140 9/1986 Whitlock et al. ........... 310/313 R X
4,665,374 5/1987 Fathimulla .................. 310/313 R X
4,672,254 6/1987 Dolat et al. ................... 310/313 R
4,683,395 7/1987 Mitsutsuka ................... 310/313 R
4,757,226 7/1988 Mitsutsuka et al. ............ 310/313 A Primary Examiner—Mark O. Budd
Attorney, Agent, or Firm—McCormick, Paulding & Huber

[57] ABSTRACT

A novel heterojunction acoustic charge transport device (HACT) includes a modulation doped field effect transistor (MODFET) on the same substrate. The device is characterized by a sequence of epitaxial layers such that the MODFET is fabricated in a first portion of the uppermost layers while the HACT device is fabricated in an adjacent second portion using a partially overlapping subset of the lower layers after selected upper ones have been removed to form a single integrated electro-acoustic device.

12 Claims, 1 Drawing Sheet

U.S. Patent  Nov. 28, 1989  4,884,001
FIG. 1
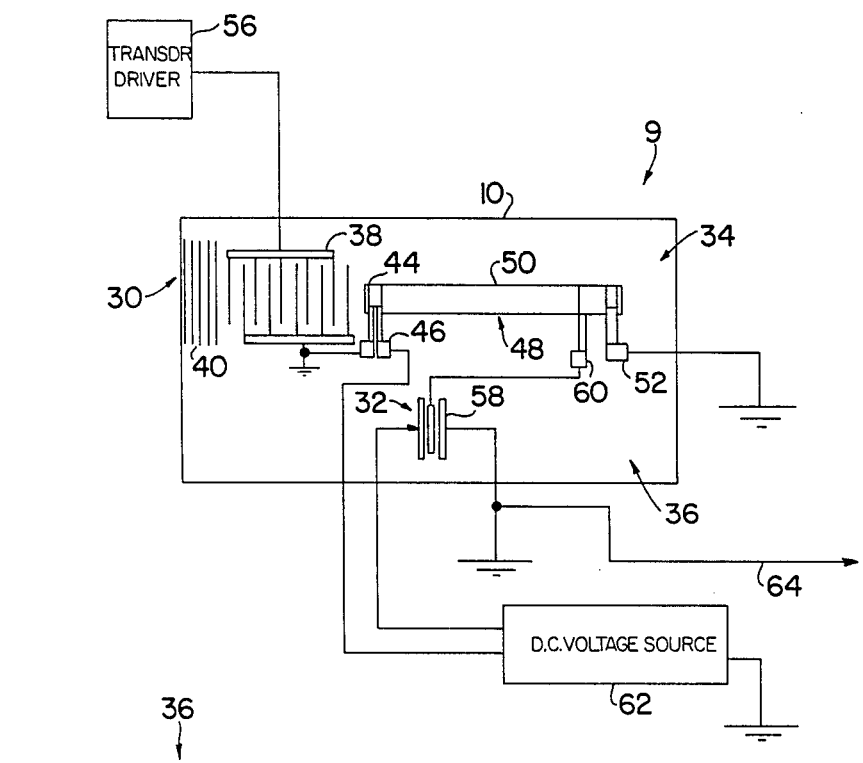
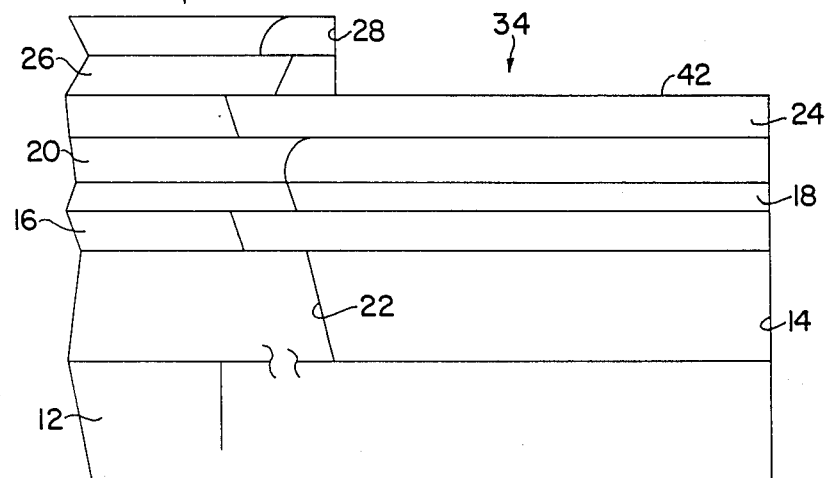
FIG. 2

MONOLITHIC ELECTRO-ACOUSTIC DEVICE HAVING AN ACOUSTIC CHARGE TRANSPORT DEVICE INTEGRATED WITH A TRANSISTOR

The Government has rights in this invention pursuant to Contract No. F33615-86-C-1138 awarded by the U.S. Air Force.

TECHNICAL FIELD

This invention relates to electro-acoustic devices and more particularly to devices having an acoustic charge transport device fabricated on a substrate with a transistor.

CROSS-REFERENCE TO RELATED APPLICATIONS

Some of the subject matter hereof is disclosed and claimed in the commonly owned, copending U.S. patent applications entitled "Quantum Well Acoustic Charge Transport Device", "Optically Modulated Acoustic Charge Transport Device" and "Acoustic Charge Transport Device Having Direct Optical Input", each of which is incorporated herein by reference.

BACKGROUND OF THE INVENTION

Acoustic charge transport (ACT) phenomena in III-IV semiconductor material has only recently been demonstrated. Such devices have applications as high speed analog signal processors. Delay lines have been fabricated in gallium arsenide (GaAs) substrates comprising a surface acoustic wave (SAW) transducer that launches a surface acoustic wave along an upper layer of the GaAs substrate having a transport channel formed therein. An input electrode sources charge to be transported by the propagating potential wells and an electrode receiving a signal for modulating that charge. Spaced down the transport channel are one or more nondestructive sensing (NDS) electrodes for sensing the propagating charge and finally an ohmic output electrode for removing the charge.

Initial acoustic charge transport devices comprised a thick epilayer (TE-ACT), with vertical charge confinement accomplished by means of an electrostatic DC potential applied to metal field plates on the top and bottom surfaces of the GaAs substrate. The field plate potentials are adjusted to fully deplete the epilayer and produce a potential maximum near the midpoint thereof. Consequently, any charge injected into the channel is confined to the region of maximum DC potential.

Lateral charge confinement (Y direction) has been achieved in several ways. Typically, a mesa is formed to define a charge transport channel. However, for thick epilayer acoustic transport devices, the mesa must be several microns in height, a fact which presents problems in fabrication and is a major impediment to the propagating surface acoustic wave. Blocking potentials extending down both sides of the delay line have also been used to define the transverse extent of the channel, as has proton bombardment to render the material surrounding the channel semi-insulating.

Recently a heterostructure acoustic charge transport (HACT) device has been fabricated using a GaAs/AlGaAs heterostructure that is similar to that of quantum well lasers and heterostructure field effect transistors (FET). A HACT device vertically confines mobile carriers through the placement of potential steps that result from band structure discontinuities. Besides providing for inherent vertical charge confinement, the HACT devices are thin film devices whose layers have a total thickness of approximately 0.25 microns, excluding a buffer layer.

SUMMARY OF THE INVENTION

An object of the present invention is to provide a monolithic device having a heterostructure acoustic charge transport device integrated with a field effect transistor.

According to the present invention, a hybrid device having an acoustic charge transport device monolithically integrated with a transistor includes a substrate structure having first and second portions formed in piezoelectric semiconducting substrate. An acoustic charge transport device is formed in the first structure portion that includes a transducer for launching along a propagation axis surface acoustic waves characterized by maxima and minima of electric potential which transport electrical charge provided thereto. A reflector is formed in the first portion at an end thereof adjacent the transducer for reflecting the surface acoustic waves. A first electrode is included to provide electrical charges to the surface acoustic waves. A transport channel is formed in the substrate and to have a major dimension extending parallel to the propagation axis. The transport channel receives the charges and provides lateral and vertical confinement thereof as the surface acoustic waves propagate. A second electrode receives modulation signals which alter the electrical potential barrier height within the transport channel in accordance with the modulation signals to control the amount of charge propagating with the surface acoustic waves. A third electrode is configured with the transport channel for sensing the modulated propagating charge in generating an electrical signal indicative thereof. A fourth electrode is provided at a distal end of the transport channel to remove the propagating charges. The hybrid integrated device is characterized by a transistor formed in the second structure portion which includes a source for providing electrical carriers, a gate that receives control signals for controlling the amount of carriers provided from the source and a drain for receiving the carriers.

BRIEF DESCRIPTION OF THE DRAWINGS

FIG. 1 is a simplified illustration of an electrical circuit having a hybrid device provided according to the present invention.

FIG. 2 is a diagrammatic illustration showing conduction band potential across several material layers in the device of FIG. 1.

DESCRIPTION OF THE PREFERRED EMBODIMENT

Referring now to FIG. 1, there is a schematic illustration of circuit 9 having a hybrid electro-acoustic device provided according to the present invention. The device 10 is preferably comprised of a III–IV material, such as GaAs and AlGaAs which is both piezoelectric and semiconducting. As is known, these materials are very closely lattice matched, having lattice parameters that differ by less than 0.0008 mm. As a result, their ternary solutions are nearly ideal for preparation by epitaxial growth. In addition, the energy band gap of an AlGaAs compound ($Al_xGa_{1-x}As$) increases monotonically with the parameter x up to x approximately equal to 0.4, at which point the band gap of the ternary becomes indirect. Conduction band potential steps as large as 0.3 ev can be obtained in a heterostructure device.

For acoustic charge transport, the device 10 provides vertical charge confinement through formation of a potential well within a GaAs/AlGaAs layered structure using the differences in the conduction band energies of select contiguous layers. No external applied potentials are required for charge confinement in the vertical direction in the device 10. Moreover, the heterojunction band structure potential is a property of the composite material alone and is not diminished by the transport charge load.

Referring now to FIG. 2 there is shown a sectioned diagrammatic illustration. showing conduction band potential across the material layers in the device of FIG. 1. On a semi-insulating GaAs substrate 12 there is formed an (AlGa)As or GaAs unintentionally doped layer 14. The buffer layer receives a layer 40 nm thick layer 16 of GaAs which forms the first transport channel. A first, unintentionally doped layer 18 of (AlGa)As is then grown on layer 16 and a second upper layer 20 of (AlGa)As is subsequently grown on the layer 18 with a doping of $2 \times 10^{17}$. Preferably, the charge control layer 20 is 700 A in thickness.

As indicated by the conduction band potential of GaAs layers 16 and (AlGa)As layers 14 and 18 (curve 22), a potential well 0.25 ev deep is created in the GaAs layer 16 which serves to confine the charge in the first transport channel. The thickness and doping level of the (AlGa)As layer 20 is designed to provide a sufficient number of electrons to fill the surface states therein while leaving the remainder of the structure essentially free of excess carriers. In the device of FIG. 1, a mole fraction of 32% aluminum was used. As noted above, the heterostructure structure described with respect to FIG. 2 provides for vertical charge confinement and eliminates the need for backgating consideration and external biasing, as is necessary for conventional acoustic charge transport devices.

The first transport channel formed in the device 10 differs from a double heterostructure FET devices in that the charge in a FET transistor is supplied by donors in the (AlGa)As layers. However, with the HACT device 10, the transport channel is initially empty and charges are pulled into the first transport channel through an ohmic contact by the surface acoustic wave potential. The first GaAs transport channel is undoped to provide high electron mobility, and there is an increased charge transfer efficiency due to a limited charge packet volume and lower bulk charge trapping.

As noted above, it is necessary to monolithically integrate active electronic devices, such as MODFETS, on a substrate with heterostructure acoustic charge transport (HACT) devices in order to provide for signal amplification and impedance matching. Monolithic integration is not possible with known (HACT) devices since electrical properties of the material structures thereof form an empty quantum well. However, the present invention is characterized by a novel material structure in which the epilayers needed for a modulation doped field effect transistor (MODFET) are formed subsequent to and partially overlapping those needed for the HACT device.

On charge control layer 20 the present invention provides for a layer 24 of unintentionally doped GaAs that comprises a second transport channel as it forms a quantum well structure in which current for the MODFET will flow. A charge control layer 26 of (AlGa)As approximately 40 nm in thickness is grown on layer 24. Finally, a cap layer 28 of GaAs 20 nm thick is fabricated on layer 26. Both layers 26 and 28 are grown using known techniques and doped, preferably to $2 \times 10^{18}/cm^3$.

To fabricate the device 10 the material structure described hereinabove is first grown. A transistor is then conventionally fabricated at one location on the upper surface of the device. In an adjacent location, the layer 28 is subsequently etched off using a 50/50 solution of hydrogen peroxide and water with a PH of 8.2 (obtained, for example, by using ammonium hydroxide). The layer 26 is removed in a similar manner, preferably by exposure to hydrofluoric acid at 30 degrees C. A HACT device is then formed at this location. For the HACT device, the layer 24 will also prevent oxidation of the (AlGa)As layer and aid in the formation of electrical contacts.

Referring again to FIG. 1, the monolithic integrated electro-acoustic device 10 is seen to comprise a heterostructure surface acoustic wave (HACT) device 30 and a modulation doped field effect transistor 32 each formed in respective portions 34 and 36 of the device 10. A heterostructure acoustic charge transport device includes a surface acoustic wave transducer 38 and reflector 40. The transducer is formed in a known manner and preferably comprises an interdigitated (IDT) transducer of aluminum copper alloy deposited on surface 42 of layer 24 in portion 34. Those skilled in the art will note that ion implantations (or mesa isolation) is necessary to render the material under the SAW transducer semi-insulating.

Similarly, the reflector comprises a plurality of etched grooves or metal strips formed in a known manner to reflect the surface acoustic wave along the surface 42. Spaced on the surface from the transducer is an input ohmic electrode 44 for providing charge. The charge is received by the surface acoustic wave in potential wells and is propagated along the device in the first transport channel. The potential barrier height controls the amount of propagating charge and is modulated in accordance with signals provided at the input Schottky electrode 46. Lateral confinement of the propagating charge is preferably accomplished by proton implant to produce a semi-insulating area 48 surrounding the first transport channel 50 on the surface. The charge is extracted from the device at the output ohmic electrode 52.

Besides the device 10, circuit 9 includes a transducer driver 56 for launching the surface acoustic waves along the first transport channel 50. The transistor 32 is a modulation doped field effect transistor having a source providing electrical carriers to a drain which is controlled by a gate 58. In the device of FIG. 1, the control signals presented to the gate is received from Schottky electrode 60 of the device 30. In addition to providing signals to input Schottky electrode 46, signal source 62 also biases the transistor. An amplified signal is then presented to external circuitry on line 64.

Similarly, although the invention has been shown and described with respect to a preferred embodiment thereof, it should be understood by those skilled in the art that various other changes, omissions and additions thereto may be made therein without departing from the spirit and scope of the present invention.

We claim:

1. A hybrid integrated device having an acoustic charge transport device monolithically integrated with a transistor, comprising:
a substrate structure having first and second portions formed in a piezoelectric semiconducting substrate;
an acoustic charge transport device formed in said first structure portion including
a transducer means for launching along a propagation axis surface acoustic waves characterized by maxima and minima of electrical potential which transport electrical charge provided thereto;
a reflector means formed in said first portion at an end thereof adjacent to said transducer means for reflecting said surface acoustic waves;
a first electrode means for providing electrical charges to said surface acoustic waves,
a transport channel formed in said substrate to have a major dimension extending parallel to said propagation axis, said channel, for receiving said charges and providing lateral and vertical confinement of said charges propagating with said surface acoustic waves;
a second electrode means receiving modulation signals and electrically configured with said transport channel to alter the electrical potential barrier height therein in accordance with said modulation signals, thereby controlling the amount of charge propagating with said surface acoustic waves,
a third electrode means configured with said transport channel for sensing said modulated propagating charge and generating an electrical signal indicative thereof;
a fourth electrode means configured with said transport channel at an end thereof distal to said first electrode means for electrically removing said propagating charge; and
a transistor means formed in said second structure portion including
a source means for providing electrical carriers;
a gate means receiving control signals for controlling the amount of carriers provided from said source means;
a drain means for receiving said carriers.

2. The device of claim 1 wherein said transistor means further comprises a phototransistor wherein said modulation signals correspond to a modulated optical beam received therein.

3. The device of claim 1 wherein said substrate comprises Group III-V material.

4. The device of claim 1 wherein said material comprises gallium arsenide.

5. The device of claim 1 wherein said acoustic charge transport device comprises a heterostructure acoustic charge transport device wherein said substrate structure first portion includes an unintentionally doped first aluminum-gallium arsenide layer grown on said substrate, an unintentionally doped first gallium arsenide layer grown on said aluminum-gallium arsenide layer and a doped second aluminum-gallium arsenide layer grown on said unintentionally doped gallium arsenide layer.

6. The device of claim 1 wherein said structure further comprises an unintentionally doped second gallium arsenide layer.

7. The device of claim 1 wherein said transistor means comprises a modulated doped field effect transistor (MODFET) and wherein said substrate structure second portion comprises an unintentionally doped first aluminum-gallium arsenide layer grown on said substrate, an unintentionally doped first gallium arsenide layer grown on said aluminum-gallium arsenide layer and a doped second aluminum-gallium arsenide layer grown on said unintentionally doped first gallium arsenide layer, an unintentionally doped second gallium arsenide layer grown on said doped second aluminum gallium arsenide layer, a third, doped layer of aluminum gallium arsenide grown on said second layer of gallium arsenide, and a fourth layer of gallium arsenide grown on said third layer of aluminum gallium arsenide.

8. The device of claim 1 wherein said acoustic charge transport structure further comprises an ion implanted region encompassing said transport channel for providing lateral confinement of said propagating charge.

9. A method of fabricating a hybrid device having an acoustic charge transport device monolithically integrated with a transistor comprising the steps of:
growing on a gallium arsenide substrate a first layer of aluminum gallium arsenide;
growing a first layer of gallium arsenide on said first layer of aluminum gallium arsenide;
growing a second layer of aluminum gallium arsenide on said first layer of gallium arsenide;
growing a second layer of gallium arsenide on said second layer of aluminum gallium arsenide;
growing a third layer of aluminum gallium arsenide on said second layer of gallium arsenide;
doping said third layer of aluminum gallium arsenide;
growing a fourth layer of gallium arsenide layer on said third layer of aluminum gallium arsenide;
removing from a first portion of said structure said third layer of aluminum gallium arsenide and fourth layer of gallium arsenide;
defining an acoustic charge transport device in said first structure portion, including
a transducer means for launching along a propagation axis surface acoustic waves characterized by maxima and minima of electrical potential which transport electric charge provided thereto;
a reflector means formed in said first portion at an end thereof adjacent to said transducer means for reflecting said surface acoustic waves;
a first electrode means for providing electrical charges to said surface acoustic waves,
a transport channel formed in said substrate to have a major dimension extending parallel to said propagation axis, said channel receiving said charges for providing lateral and vertical confinement of said charges propagating with said surface acoustic waves;
a second electrode means receiving modulation signals and electrically configured with said transport channel to alter the electrical potential barrier height therein in accordance with said modulation signals, thereby controlling the amount of charge propagating with said surface acoustic waves,
a third electrode means configured with said transport channel for sensing said modulated propagating charge and generating an electrical signal indicative thereof;
a fourth electrode means configured with said transport channel at an end thereof distal to said first electrode means for electrically removing said propagating charge; and
defining in a second structure portion a transistor means including
a source means for providing electrical carrier;

a gate means receiving control signals for controlling the amount of carriers provided from said source means;

a drain means for receiving said carriers.

10. An electrical circuit having a hybrid device with an acoustic charge transport device monolithically integrated with a transistor, comprising:

a substrate structure having first and second portions formed in a piezoelectric semiconducting substrate;

an acoustic charge transport device formed in said first structure portion including a transducer means for launching along a propagation axis surface acoustic waves characterized by maxima and minima of electrical potential which transport electric charge provided thereto;

a reflector means formed in said first portion at an end thereof adjacent to said transducer means for reflecting said surface acoustic waves;

a first electrode means for providing electrical charges to said surface acoustic waves, a transport channel formed in said substrate to have a major dimension extending parallel to said propagation axis, said channel receiving said charges for providing lateral and vertical confinement of said charges propagating with said surface acoustic waves;

a second electrode means receiving modulation signals and electrically configured with said transport channel to alter the electrical potential barrier height therein in accordance with said modulation signals, thereby controlling the amount of charge propagating with said surface acoustic waves, a third electrode means configured with said transport channel for sensing said modulated propagating charge and generating an electrical signal indicative thereof;

a fourth electrode means configured with said transport channel at an end thereof distal to said first electrode means for electrically removing said propagating charge;

a transistor means formed in said second structure portion including a source means for providing electrical carrier;

a gate means receiving control signals for controlling the amount of carriers provided from said source means;

a drain means for receiving said carriers, a means for supplying said modulation signals;

a transducer driver means for supplying to said transducer means electrical signals corresponding to said surface acoustic waves;

a means for providing bias signals to said source means and said drain means.

11. The circuit of claim 11 wherein said transistor means further comprises a phototransistor wherein said modulation signals correspond to a modulated optical beam received therein.

12. The circuit of claim 11 wherein said signals output from said third electrode comprise said gate control signals.

* * * * *